United States Patent
van der Laan

(10) Patent No.: US 8,938,278 B2
(45) Date of Patent: Jan. 20, 2015

(54) SUPERCONDUCTING CABLES AND METHODS OF MAKING THE SAME

(75) Inventor: Daniel Cornelis van der Laan, Boulder, CO (US)

(73) Assignee: The Regents of the University of Colorado, Denver, CO (US)

( * ) Notice: Subject to any disclaimer, the term of this patent is extended or adjusted under 35 U.S.C. 154(b) by 97 days.

(21) Appl. No.: 13/398,746

(22) Filed: Feb. 16, 2012

(65) Prior Publication Data

US 2012/0214675 A1 Aug. 23, 2012

Related U.S. Application Data

(60) Provisional application No. 61/444,673, filed on Feb. 18, 2011.

(51) Int. Cl.
*H01L 39/14* (2006.01)
(52) U.S. Cl.
CPC .......... *H01L 39/143* (2013.01); *G01L 39/2419* (2013.01)
USPC ....................................................... 505/231
(58) Field of Classification Search
USPC ............... 505/230, 231, 232, 430, 431, 433; 174/125.1
See application file for complete search history.

(56) References Cited

U.S. PATENT DOCUMENTS

| | | | |
|---|---|---|---|
| 5,932,523 A * | 8/1999 | Fujikami et al. | 505/231 |
| 6,759,593 B2 | 7/2004 | Spreafico | |
| 6,794,579 B1 | 9/2004 | Caracino et al. | |
| 6,864,430 B2 | 3/2005 | Hughey et al. | |
| 6,951,985 B1 | 10/2005 | Lemelson | |
| 6,988,915 B2 * | 1/2006 | Hirose | 439/668 |
| 7,149,560 B2 | 12/2006 | Ohmatsu | |
| 7,231,239 B2 | 6/2007 | Schmidt | |

(Continued)

FOREIGN PATENT DOCUMENTS

| | | |
|---|---|---|
| JP | 05-334921 | 12/1993 |
| JP | 06-044834 | 2/1994 |

(Continued)

OTHER PUBLICATIONS

International Search Report and Written Opinion from related PCT application No. PCT/US2012/025693, mailed Jan. 2, 2013, 10 pages.

(Continued)

*Primary Examiner* — Colleen Dunn
(74) *Attorney, Agent, or Firm* — Foley & Lardner LLP

(57) ABSTRACT

Superconducting cables employ one or more superconducting tapes wound around a former. A compact superconducting cable is configured using a former having a small diameter, e.g., less than 10 millimeters. A flexible superconducting cable is configured with a former made of a flexible material. Superconducting tape conductors are wound around the former, with the superconducting layer in compression on the inside of the wind turns of the wind, to prevent irreversible damage to the superconductor. A layer of solder is on the superconducting tape(s) or solder sheaths are wound between tape conductors in each layer. The one or more solder layers or sheaths are melted to cause the solder to flow within the structure, to bond some or all of the superconducting tape conductors together and form a mechanically strong cable with an enhanced level of electrical connectivity between tapes in the cable.

44 Claims, 3 Drawing Sheets

(56) References Cited

U.S. PATENT DOCUMENTS

| | | | |
|---|---|---|---|
| 7,238,887 | B2 | 7/2007 | Hirose |
| 7,445,681 | B2 * | 11/2008 | Akimitsu et al. ............. 148/420 |
| 7,498,698 | B2 | 3/2009 | Yamaguchi |
| 7,598,458 | B2 | 10/2009 | Yumura et al. |
| 7,723,616 | B2 | 5/2010 | Hirose |
| 7,735,212 | B1 | 6/2010 | Willen |
| 7,763,806 | B2 * | 7/2010 | Hirose ....................... 174/125.1 |
| 2009/0048114 | A1 | 2/2009 | Akimitsu et al. |

FOREIGN PATENT DOCUMENTS

| | | |
|---|---|---|
| JP | 07-122133 | 5/1995 |
| JP | 07-130231 | 5/1995 |
| JP | 07-169343 | 7/1995 |
| JP | 09-102226 | 4/1997 |
| JP | 2002-008459 | 1/2002 |
| JP | 2004-158448 | 6/2004 |
| JP | 2008-047519 | 2/2008 |
| JP | 2008-244249 | 10/2008 |
| JP | 2009-110906 | 5/2009 |
| JP | 2010-192116 | 9/2010 |
| KR | 102008010070 A | 11/2008 |
| KR | 100903349 | 6/2009 |
| WO | WO-2007/016492 | 2/2007 |
| WO | WO-2008/082149 | 7/2008 |

OTHER PUBLICATIONS

"Compact GdBa2Cu3O7-coated conductor cables for high-field magnet applications", Danko van der Laan & Xifeng Lu (University of Colorado & National Institute of Standards and Technology); T.C. Stauffer & L.F. Goodrich (National Institute of Standards and Technology), LTHFSW 2010, Nov. 9, Monterey, CA.

"Compact REBCO coated conductor cables for electric power transmission and high-field magnet applications", D.C. van der Laan & X.F. Lu (University of Colorado & National Institute of Standards and Technology); C.C. Clickner & L.F. Goodrich (National Institute of Standards and Technology); T.J. Haugan (Air Force Research Laboratory, Wright-Patterson AFB), CEC-ICMC, Jun. 17, 2011, Spokane, WA.

"Electromechanical properties of YBa2Cu3O7-Coated Conductors", Danko van der Laan, Univ. of Colorado & National Institute of Standards and Technology, CCA 2010, Oct. 30, Fukuoka, Japan.

"RE-Ba2Cu3O7-coated conductor cables for electric power transmission and high-field magnet applications", D.C. van der Laan & X.F. Lu (Univ. of Colorado & National Institute of Standards & Technology); L.F. Goodrich (National Institute of Standards and Technology); T.J. Haugan (Air Force Research Laboratory, Wright-Patterson AFB); G.E. Miller, P.D. Noyes and H.W. Weijers (National Magnetic Field Laboratory), Superconductivity Centennial Conference, Sep. 20, 2011, Den Haag, The Netherlands.

"RE-Ba2Cu3O7-coated conductor helical cables for electric power transmission and SMES", DC van der Laan and XF Lu (Univ. of Co & Natl. Inst. of Standards and Technology); JF Douglas, CC Clickner, TC Stauffer and LF Goodrich (Natl. Inst. of Standards and Technology); TJ Haugan (AF Research Lab., Wright-Patterson AFB); D. Abraimov, AA Polyanskii and DC Larbalestier (Applied Superconductivity Group); GE Miller, PD Noyes & HW Weijers, EPRI Superconductivity Conference, Oct. 12, 2011, Tallahasee, FL.

"REBCO cables for high-field magnets and magnet feeders", D.C. van der Laan and X.F. Lu (Univ. of Colorado and National Institute of Standards and Technology); G.E. Miller, P.D. Noyes and H.W. Weijers (National High Magnetic Field Laboratory); L.F. Goodrich (National Institute of Standards and Technology); T.J. Haugan (Air Force Research Lab., Wright-Patterson AFB), LTHFSW 2011, Nov. 8, Providence, RI.

"Ultra-compact YBCO cables for low ac-loss and high-field magnet applications", D.C. van der Laan (University of Colorado); R.C. Duckworth, T. Ha, Y. Zhang (Oak Ridge National Laboratory); J.F. Douglas, T.C. Stauffer and L.F. Goodrich (National Institute of Standards and Technology); V. Selvamanickam (Univ. of Houston,) ASC 2010, Aug. 6, Washington D.C.

Superconductor Science and Technology, "Compact GdBa2Cud07-coated conductor cables for electric power transmission and magnet applications", D C van der Laan, X F Lu and L F Goodrich, 7 pages, published Feb. 10, 2011.

Superconductor Science and Technology, "High-current dc power transmission flexible RE-Ba2Cu3O7- coated conductor cables", D C van der Laan, L F Goodrich and T J Haugan, 5 pages, published Dec. 1, 2011.

Superconductor Science and Technology, "YBa2Cu3O7-coated conductor cabling for low ac-loss and high field magnet applications", D C van der Laan, 6 pages, published Apr. 28, 2009.

"Progress in compact RE-Ba$_2$Cu3O7-coated conductor cables for dc power transmission and high-field magnet applications", D.C. van der Laan (University of Colorado); G.E. Miller, P.D. Noyes and H.W. Weijers (National High Magnetic Field Laboratory); L.F. Goodrich (National Institute of Standards and Technology); T.J. Haugan (Air Force Research Laboratory, Wright-Patterson AFB), p. 1 only.

Japanese Office Action dated Jan. 16, 2014, from related Japanese patent application No. 2013-554646.

Chinese Office Action dated Jun. 5, 2014, from related Chinese patent application No. 201280019170.3.

Japanese Office Action dated Jun. 5, 2014, from related Japanese patent application No. 2013-554646.

\* cited by examiner

SUPERCONDUCTING CABLES AND METHODS OF MAKING THE SAME

RELATED APPLICATIONS

This invention relates to priority U.S. Provisional Patent Application Ser. No. 61/444,673, filed Feb. 18, 2011 which is incorporated herein by reference.

GOVERNMENT RIGHTS

This invention was made with government support under grant number 1P0914 awarded by the National Institute of Standards and Technology (NIST). The government has certain rights in the invention.

FIELD OF THE INVENTION

Embodiments of the present invention relate to superconducting cables and, in particular embodiments, to superconducting cables having one or more superconducting tape conductors wound around a generally flexible former.

BACKGROUND

Significant advances have been made in the development and use of superconducting materials over the last decade. High temperature superconducting materials can be used in a variety of applications, including superconducting electrical coils, superconducting cables and flexible, superconducting tapes. Superconducting tapes can include one or more layers of superconducting material supported on a flat surface of a flexible tape substrate.

As superconducting materials technology improves, the useful applications for such materials increases. For example, such materials can be employed to form superconducting power transmission cables, superconducting magnet cables, and other superconducting electrical devices.

SUMMARY

Embodiments of the present invention relate to superconducting cable configurations and processes that can provide a superconducting cable having a relatively small diameter. Further embodiments are configured to provide a relatively flexible superconducting cable, to allow the cable to bend to a certain extent without damaging the cable.

According to embodiments of the present invention, a superconducting cable is provided by winding one or more superconducting tapes in one or more layers around a length of a core or former. A relatively compact superconducting cable is configured by employing a former having a sufficiently small diameter. In example embodiments of the present invention, one or more superconducting tapes are wound around a former having a diameter of less than 10 millimeters (mm) A flexible superconducting cable is configured with a former that is made of a relatively flexible material.

In particular embodiments, one or more superconducting tape conductors are wound around a former, with the superconducting layer(s) in an axial compressive state to prevent irreversible damage to the superconductor. For example, one or more (or all) of the superconducting tape conductor(s) are oriented with their superconducting layers on the inside of the turns of the wind. In this manner, the superconducting tape conductor(s) may be wound with their superconducting layers under compression.

In further embodiments, the former is also wound with one or more additional conductors (or tape conductors) that are not superconducting (but are normal electrical conductors). An electrically insulating layer may be provided over, in between, or around the tape conductors.

In further embodiments, one or more of the tape conductors is coated with a layer of solder or other suitable substance that can be selectively melted or flowed and hardened. In yet further embodiments, a superconducting cable includes one or more solder sheaths wound between tape conductors in each layer. Alternatively, or in addition, one or more solder sheaths may be wound around the former, between one or more pairs of adjacent layers in the cable. After cable components have been assembled, the one or more sheaths and layers of solder are melted to cause the solder to flow within the structure. The solder flows to and bonds some or all of the superconducting tape conductors together, to form a mechanically strong and electrically well-connected cable.

Further embodiments of the present invention relate to methods of making a superconducting cable. Such methods include winding one or more superconducting tape conductors (or arrangements of one or more superconducting tape conductors and one or more normal conductors) around a former. Further embodiments include coating one or more of the superconducting tape conductors (and/or one or more normal conductors) with solder and melting the solder after assembly of the layers of tape conductors on the former. Yet further embodiments include winding one or more solder sheaths, normal conducting and/or insulated resistive wires or tapes with or between the tape conductors.

Thus, according to embodiments of the present invention superconducting cables can be formed to be relatively compact, yet include appropriate electrical configurations (e.g., for handling multiple signals or phases), exhibit sufficient mechanical strength and durability for various environments of use and, in some examples, have sufficient flexibility to bend.

General embodiments of the present invention relate to a superconducting cable comprising a former; a plurality of superconducting tape conductors wound in at least one layer around the former in a helical fashion, each superconducting tape conductor having at least one superconducting layer. In particular embodiments, the former has an outer diameter of less than ten millimeters (10 mm). Also in particular embodiments, the former is flexible.

In yet further embodiments, the plurality of superconducting tape conductors are wound around the former with pretension.

In yet further embodiments, the plurality of superconducting tape conductors are wound around the former with a gap between the winds of at least two conductors.

In further embodiments at least one of the plurality of superconducting tape conductors is wound such that a superconducting layer on the superconducting tape conductor is located on the inside of the wind, under compression.

In further embodiments, at least one of the plurality of superconducting tape conductors is wound such that a superconducting layer on the superconducting tape conductor is located on the outside of the wind, under tension.

In further embodiments, at least one of the plurality of superconducting tape conductors is wound such that a superconducting layer on the superconducting tape conductor is located in a central position on the tape conductor, under neither tension nor compression from the wind.

In further embodiments, at least one layer comprises a plurality of layers of superconducting tape conductors, and where each layer is wound in a different winding direction as an adjacent layer.

In further embodiments, at least one layer comprises a plurality of layers of superconducting tape conductors, each layer being wound at a pitch angle that is different from a pitch angle of tape conductors wound in an adjacent layer.

In further embodiments, the former has a cross-section shape that is oval or rectangular with rounded corners, with the radius of the corners being less than five millimeters (5 mm).

In further embodiments, at least one layer comprises a plurality of layers of superconducting tape conductors, and where at least one insulation layer is provided between adjacent layers of superconducting tape conductors.

In further embodiments, at least one layer comprises a plurality of layers of superconducting tape conductors, and where at least one conductor is insulated.

In further embodiments, at least one of the superconducting tape conductors is coated with a layer of solder that is configured to be melted after the cable is assembled.

In further embodiments, a solder sheath wound between adjacent winds of the at least one superconducting tape conductor, where the solder sheath is configured to be melted after the cable is assembled.

In further embodiments, a solder sheath wound between adjacent layers, where the solder sheath is configured to be melted after the cable is assembled.

In further embodiments, at least one conductor of non-superconducting, conductive material wound between adjacent windings of the at least one superconducting tape conductor.

In further embodiments, the at least one conductor of non-superconducting, conductive material is covered by a layer of solder configured to be melted.

In further embodiments, the at least one layer comprises a plurality of layers of superconducting tape conductors, and the superconducting cable further comprises at least one layer of one or more non-superconducting conductors wound between adjacent layers of the plurality of layers of superconducting tape conductors. For example, a heater wire/tape may be wound around the former, between tapes in at least one layer, or between layers.

In further embodiments, a bundle of superconducting cables includes a plurality of superconducting cables, each having a configuration according to any of the above embodiments, where at least one superconducting cable has an outer insulating layer and is held in a bundle with the other superconducting cables of the plurality of superconducting cables, or where each superconducting cable lacks an outer insulating layer and is held in a bundle with the other superconducting cables of the plurality of superconducting cables and the bundle may comprise a sheath made of a metal, or any other conductive or non-conductive material covering the bundle of cables.

In further embodiments, a method of making a superconducting cable comprises: providing a former, and winding a plurality of superconducting tape conductors in at least one layer around the former in a helical fashion, each superconducting tape conductor having at least one superconducting layer. In further embodiments of that method, the former has an outer diameter of less than ten millimeters (10 mm). In further embodiments of that method, the former is flexible.

In further embodiments, winding the plurality of superconducting tape conductors comprises winding the plurality of superconducting tape conductors around the former with a gap between at least two conductors.

In further embodiments, winding the plurality of superconducting tape conductors comprises winding the plurality of superconducting tape conductors around the former with pretension.

In further embodiments, winding the plurality of superconducting tape conductors comprises winding such that a superconducting layer on each superconducting tape conductor is located on the inside of the wind, under compression.

In further embodiments, at least one of the plurality of superconducting tape conductors is wound such that a superconducting layer on the superconducting tape conductor is located on the outside of the wind, under tension.

In further embodiments, winding the plurality of superconducting tape conductors comprises winding such that a superconducting layer on the superconducting tape conductor is located in a central position on the tape conductor, under neither tension nor compression from the wind.

In further embodiments, at least one layer comprises a plurality of layers of superconducting tape conductors, and winding the plurality of superconducting tape conductors comprises winding each layer in a different winding direction as an adjacent layer.

In further embodiments, at least one layer comprises a plurality of layers of superconducting tape conductors, and winding the plurality of superconducting tape conductors comprises winding each layer at a pitch angle that is different from a pitch angle of tape conductors wound in an adjacent layer.

In further embodiments, at least one layer comprises a plurality of layers of superconducting tape conductors, and the method further comprises providing at least one insulation layer between each adjacent layer of superconducting tape conductors.

In further embodiments, at least one layer comprises a plurality of superconducting tape conductors, and the method further comprises insulating at least one superconducting tape conductor.

In further embodiments, the method further comprises coating at least one of the superconducting tape conductors with a layer of solder, and melting the solder after the at least one superconducting tape conductor is wound around the former.

In further embodiments, the method further comprises winding a solder sheath between adjacent winds of the at least one superconducting tape conductor, and melting the solder sheath after the at least one superconducting tape conductor is wound around the former. For example, a method may include winding a heater wire/tape around the former, between tapes in at least one layer, or between layers.

BRIEF DESCRIPTION OF THE DRAWINGS

The above and other features and other advantages of the present invention will be more clearly understood from the following detailed description taken in conjunction with the accompanying drawings, in which.

DETAILED DESCRIPTION

Figure 1:
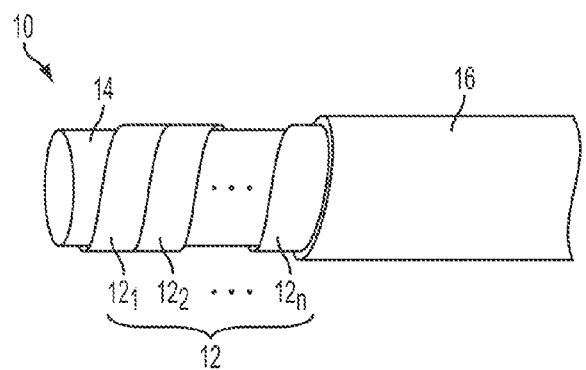
FIG. 1 is a partial, cut-away view of a superconducting cable according to an embodiment of the present invention.

A superconducting cable 10, as shown in FIG. 1, is composed of one or more superconducting tape conductors 12 that are wound around a former 14. Embodiments of the invention relate to cables and processes as described in the article titled: "$YBa_2Cu_3O_{7-\delta}$ coated conductor cabling for low ac-loss and high-field magnet applications" by D C van der Laan, (published in Superconductor Science and Technology, in 2009), the article titled: "Compact $GdBa_2Cu_3O_{7-\delta}$ coated conductor cables for electrical power transmission and magnet applications" by D C van der Laan et al. (published in Superconductor Science and Technology, in 2011), and the article titled: "High-current dc power transmission in flexible $RE-Ba_2Cu_3O_{7-\delta}$ coated conductor cables" by D C van der Laan et al. (published in Superconductor Science and Technology, in 2012) each of which is incorporated herein by reference in its entirety.

In example embodiments described herein, a relatively small diameter former 14 (for example, of less than about 10 mm) allows the cable 10 to be made relatively compact. By winding one or more superconducting tape conductors 12 with the superconducting layer in an axial compressive state, irreversible damage to the superconductor may be prevented. A flexible former 14 allows the cable to be made relatively flexible.

Accordingly, in particular embodiments, the cable 10 is configured to be flexible, from a flexible material and/or a flexible structure, to allow the cable to bend or flex to an predefined extent without being damaged. In other embodiments, the cable 10 may be formed to be rigid or relatively rigid, which may be beneficial for certain environments of use.

In example embodiments, each tape conductor 12 is a superconducting tape conductor that includes one or more superconducting layers made of a superconducting material and/or configuration that provides superconductivity in the expected operational environment of the superconducting cable 10. The superconducting tape conductors 12 may be composed of any suitable superconducting tape, including, but not limited to $YBa_2Cu_3O_{7-\delta}$ (YBCO) tape conductors, $Bi_2Sr_2Ca_2Cu_3O_x$ (Bi-2223) tape conductors, $GdBa_2Cu_3O_{7-\delta}$ (GBCO) tape conductors, YBCO or GBCO coated tape conductors manufactured by SuperPower Inc. (Schenectady, N.Y.), or other suitable superconducting tape conductor. Each superconducting tape conductor 12 is wound around the former 14, in a helical fashion.

In further embodiments, the former 14 is also wound with one or more further conductors (or tape conductors) that are not superconducting (but are normal electrical conductors), in addition to one or more superconducting tape conductors 12. An electrically insulating layer 16 may be provided over the tape conductors and may be made of any suitable electrically insulating material, such as, but not limited to electrically insulating polymers, rubbers, ceramics, nylons or the like.

The former 14 is composed of any suitable material and, in particular embodiments, is composed of a flexible material that allows the cable 10 to be flexible, where such flexible material may include, for example, but not limited to copper or other metals, polymers, rubbers, ceramics or the like. In example embodiments, the former has a hollow form (such as a hollow, tube shape). In other embodiments, the former has a solid form (such as a solid, shaft shape). In other embodiments, the former has a solid, stranded form (such as a stranded wire or cable). In yet further example embodiments, the former may have a solid form along one or more parts of its length and a hollow form along one or more other parts of its length.

The former may be configured to have any suitable shape and outer diameter. For example, the former may have a longitudinal dimension with a cross-sectional shape (taken perpendicular to the longitudinal dimension of the former) that is circular, oval, rectangular or of other suitable polygons or closed-curves. A cable that has a more rectangular shape compared to round may be favored by some applications, for example, to simplify winding of certain magnets and other devices.

In example embodiments, the edges or corners of a polygonal cross-sectional shape of a former may be rounded. In one example, the radius of the smallest rounded edge and corner is less than about five millimeters (5 mm). The outer diameter of the former may be of any suitable size and, in particular embodiments, is less than about ten millimeters (10 mm). In non-limiting example embodiments, the former has an outer diameter that is in the range of from about 1 mm to about 10 mm and, in particular embodiments, is about 3.2 mm or about 5.5 mm.

The superconducting tape conductor(s) 12 are wound around the former 14 in a helical fashion, in one or more layers. In example embodiments, some or all of the superconducting tape conductor(s) 12 are wound with pretension. In other embodiments, the superconducting tape conductor(s) 12 are wound without pretension.

In example embodiments, one or more (or all) of the superconducting tape conductor(s) 12 wound around the former 14 are oriented with their superconducting layers on the inside of the turns of the wind. In this manner, the superconducting tape conductor(s) 12 may be wound with their superconducting layers under compression. In other embodiments, one or more (or all) of the superconducting tape conductor(s) 12 wound around the former 14 are oriented with their superconducting layers on the outside of the turns of the wind. In this manner, the superconducting tape conductor(s) 12 may be wound with their superconducting layers under tension. In yet other embodiments, one or more (or all) of the superconducting tape conductors 12 wound around the former 14 have their superconducting layers located in a central layer of the tapes, such that the superconducting layers are generally neutral with regard to compressive or tensile states. In yet further embodiments, the former 14 may be wound with multiple superconducting tape conductors 12 in a combination of any two or all three of the compression, tension and/or neutral orientations described above.

One or more superconducting tape conductors 12 may be included in each layer of tape conductors wound around the former 14. For example, each layer may include one, two, three or more separate superconducting tape conductors $12_1$, $12_2$, $12_n$ wound, adjacent each other, on the former 14. Each superconducting tape conductor $12_1$, $12_2$, $12_n$ in a layer may be wound in close proximity to (or in contact with) an adjacent superconducting tape conductor $12_1$, $12_2$, $12_n$ in the same layer. Alternatively, each superconducting tape conductor $12_1$, $12_2$, $12_n$ in a layer may be spaced apart from an adjacent superconducting tape conductor $12_1$, $12_2$, $12_n$ in the same layer by a gap. In yet alternative embodiments, one or more of the superconducting tape conductors $12_1$, $12_2$, $12_n$ in a given layer are wound in close proximity to (or in contact with) an adjacent superconducting tape conductor $12_1$, $12_2$, $12_n$ in the same layer, while one or more other superconducting tape conductors $12_1$, $12_2$, $12_n$ in the same layer are spaced apart from an adjacent superconducting tape conductor $12_1$, $12_2$, $12_n$ in the same layer by a gap. A gap between tapes in each layer can help to increase the flexibility of the cable and allow the cable to have a smaller bending radius, if desired.

In further embodiments, some or all of the layers of tape conductors on the former 14 may be separated from an adjacent layer by a gap. A gap between layers can help to increase the flexibility of the cable and allow the cable to have a smaller bending radius, if desired.

Furthermore, the one or more superconducting tape conductors 12 in each layer on the former 14 may be wound with a constant pitch angle throughout the layer. Alternatively, the one or more superconducting tape conductors 12 in each layer may be wound with a varying pitch angle through the layer. Furthermore, superconducting tape conductor $12_1$ may be wound at a pitch that is the same or, alternatively, that varies relative to the pitch of the winding of tape conductor $12_2$. Alternatively, the superconducting tape conductors 12 in plural layers on the former 14 may be wound with a constant pitch angle through each layer and/or the same pitch angle in plural layers. Alternatively, the superconducting tape conductors 12 in plural layers on the former 14 may be wound with one or more different pitch angles in each layer. In an example embodiment, the superconducting tape conductors 12 are wound in plural layers on the former 14, with the pitch angle of each layer being constant through the layer, but different from the pitch angle of an immediately adjacent layer.

Furthermore, the one or more superconducting tape conductors 12 in each layer are wound in the same direction around the former 14. However, in further embodiments, any two superconducting tape conductors 12 in a given layer may be wound in opposed directions. In yet further embodiments, the superconducting tape conductors 12 in one layer are wound in a common direction throughout that layer, while the tape conductors in an immediately adjacent layer are wound in the opposite direction. According, one or more superconducting tape conductors 12 in each layer of the cable is wound at the same, or different pitch angles, and each layer is wound at the same or opposing direction as its preceding layer.

Each of the superconducting tape conductors 12 may be covered with an insulating material, such as, but not limited to electrically insulating polymers, rubbers, ceramics, nylons or the like. In further embodiments, some, but not all of the superconducting tape conductors 12 are covered with the insulating material. In yet further embodiments, none of the superconducting tape conductors are covered with an insulating material. In yet further embodiments, some or all of the superconducting tape conductors are covered with an electrically conductive material, such as, but not limited to an electrically conductive metal, ceramic, or the like.

Thus, according to embodiments described above, a superconducting cable comprises a plurality of superconducting tape conductors, each having one or more superconducting layers, where the superconducting tape conductors are wound in a helical fashion in one or more layers around a former having an outer diameter of less than 10 mm.

In further embodiments, the superconducting cable may be configured as a multi-conductor superconducting cable for conducting two or more isolated currents of the same electrical phase on different conductors, or a multi-phase superconducting cable for conducting two or more different electrical phases. In such embodiments, multiple layers of superconducting tape conductors 12 are wound on a former 14, as described above, where each electrical phase is associated with a respective set of one or more of the layers.

Figure 2:
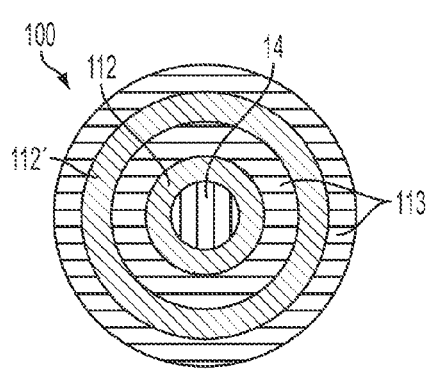
FIG. 2 is a cross-section view of a multi-conductor or multi-phase superconducting cable according to an embodiment of the present invention.
Figure 3:
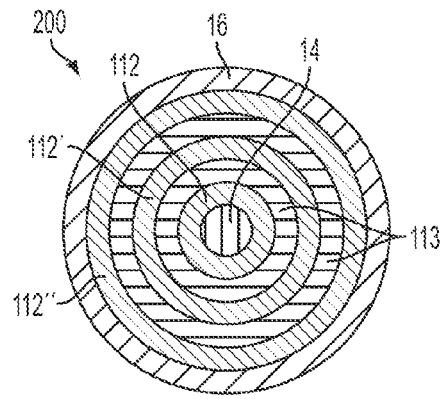
FIG. 3 is a cross-section view of a multi-conductor or multi-phase superconducting cable according to another embodiment of the present invention.

For example, FIGS. 2 and 3 show a two-section and a three-section superconducting cable 100, 200, respectively, according to embodiments of the present invention. In one example, the two-section and three-section superconducting cables are connected (or configured to be connected) as a two-phase and a three-phase superconducting cable, respectively. In the two-phase and three-phase examples, each cable 100, 200 includes one or more of the layers of superconducting tape conductors 112 (corresponding to the layer of superconducting tape conductors 12 discussed above), associated with (connected or arranged to be connected to conduct) a first electrical phase, but not a second or third electrical phase. Another one or more further layers of the superconducting tape conductor 112' (also corresponding to the layer of superconducting tape conductors 12 discussed above) are associated with (connected or arranged to be connected to conduct) the second electrical phase, but not the first phase.

In another example, the two-section and a three-section superconducting cables 100, 200 of FIGS. 2 and 3 are connected or arranged to be connected to conduct the same electrical phase, but each driven by its own respective current supply to provide a more homogeneous current distribution in the cable at high ramp rates. In the same-phase example, one or more of the layers of superconducting tape conductors 112 (corresponding to the layer of superconducting tape conductors 12 discussed above), associated with (conductively connected or arranged to be conductively connected to) a first electrical section, but not a second or third electrical section. In addition, another one or more further layers of the superconducting tape conductor 112' (also corresponding to the layer of superconducting tape conductors 12 discussed above) are associated with (conductively connected or arranged to be conductively connected to) the second electrical section, but not the first section.

In the three-phase example embodiment of FIG. 3, yet another one or more further layers of the superconducting tape conductor 112" (also corresponding to the layer of superconducting tape conductors 12 discussed above) are associated with (connected or arranged to be connected to conduct) the third electrical phase, but not the first or second electrical phase. In such embodiments, each one or more layers associated with a given electrical phase may be electrically insulated from each one or more layers associated with the other electrical phase(s) by one or more layers of an insulating material 113, as described above. For example, one or more layers of electrical insulating material may be wound or otherwise arranged between layers of superconducting tape conductors 112, 112' and 112" or between each phase (for example, between a group of one or more layers associated with one phase and a group of one or more layers associated with another phase).

In the three-section, same-phase example embodiment of FIG. 3, yet another one or more further layers of the superconducting tape conductor 112" (also corresponding to the layer of superconducting tape conductors 12 discussed above) are associated with (conductively connected or arranged to be conductively connected to) the third electrical section, but not the first or second electrical section. In such embodiments, each one or more layers associated with a given electrical section may be electrically insulated from each one or more layers associated with the other electrical section(s) by one or more layers of an insulating material 113, as described above. For example, one or more layers of electrical insulating material may be wound or otherwise arranged between layers of superconducting tape conductors 112, 112' and 112" or between each section (for example, between a group of one or more layers associated with one section and a group of one or more layers associated with another section). The different sections may be of the same electrical phase, but each driven by its own respective current supply to provide a more homogeneous current distribution in the cable at high ramp rates. In further embodiments, the number of sections could exceed three. Also, any of the multi-section (multi-phase or same-phase) embodiments may include one or more layers of outer insulating material 16.

Figure 4:
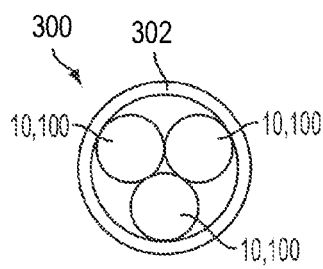
FIG. 4 is a cross-section view of a cable bundle composed of a plurality of superconducting cables, according to an embodiment of the present invention.

In further embodiments as shown in FIG. 4, two or more single-former cables 10, 100 or 200 as described above (including two or more single phase configurations, two or more multi-phase configurations or a combination of one or more single and one or more multi-phase configurations) are bundled together in a multi-former cable 300. In such embodiments, a layer of insulating material 302 as described above may be formed around a plurality of single-former cables 10, 100, 200 configured as described above.

In further embodiments, one or more of the tape conductors in any of the example embodiments described herein is coated with a layer of solder or other suitable substance that can be selectively melted or flowed and hardened. After cable components as described above have been assembled, the layer of solder is melted to cause the solder to flow within the structure. The solder flows to and bonds some or all of the superconducting tape conductors together, to form a rigid, mechanically strong cable, which can be beneficial for applications in which relatively large stresses act on the cable. In cases of an electrically conductive solder, the solder enhances the electrical connectivity between individual tapes.

In yet further embodiments, a cable as described in any of the example embodiments described herein further includes one or more solder sheaths that is wound between tape conductors in each layer. Alternatively, or in addition, one or more solder sheaths may be wound about the former 14, between one or more pairs of adjacent layers in the cable. After cable components as described above have been assembled, the one or more sheaths of solder are melted to cause the solder to flow within the structure. The solder flows to and bonds some or all of the superconducting tape conductors together, to form a rigid, mechanically strong cable, which can be beneficial for applications in which relatively large stresses act on the cable. In the case of electrically conductive solder, the solder enhances the electrical connectivity between individual tapes.

In further embodiments, a cable according to any of the example embodiments described herein includes at least one conductor of non-superconducting, normal electrical conducting material that is wound in one or more of the layers of superconducting tape conductors. In various embodiments, the shape of the conductor can vary. For example, at least one conductor of normal conducting material may be wound between two adjacent superconducting tape conductors in at least one layer. Alternatively, or in addition, at least one layer of normal conducting conductors is wound between at least one pair of adjacent layers of superconducting tape conductors. Alternatively, or in addition, at least one layer of normal conducting material is wound on top of the outer superconducting tape layer of the cable, or on the former. The normal conducting layers can form electrical connections between individual superconducting tape conductors, allowing for current sharing for example, in the event of defects or other obstructions to the current. Alternatively, or in addition, the normal conducting layers can act as a current shunt, in the event that the current in the cable exceeds a predefined maximum current that can be carried by the superconducting films.

In further embodiments, a cable according to any of the example embodiments described herein includes an outer sheath around the above-described components. The outer sheath may be made of any suitable material, including, but not limited to a metal material. The outer sheath can provide mechanical reinforcement and added strength to the cable.

In further embodiments, a cable according to any of the example embodiments described herein includes one or more normal conducting cables with one or more of the superconducting cables as described above, where all of the cables are bundled and surrounded by a sheath as described above. The normal conducting cables may be coupled to act as a current shunt, and the sheath can provide external mechanical reinforcement to the cable, as described above.

In further embodiments, a cable according to any of the example embodiments described herein includes one or more insulated resistive wires that are wound in parallel to one, or more of the superconducting tape conductors or normal conductors. In particular embodiments, these wires are used as heating wires that produce heat when conducting current, to quickly drive the cable into its non-superconducting, normal in case of a quench.

Further embodiments of the present invention relate to methods of making a superconducting cable as described above. Such methods include winding one or more superconducting tape conductors (or arrangements of one or more superconducting tape conductors and one or more normal conductors) around a former, as described above and shown in the drawings. Further embodiments of such methods include coating one or more of the superconducting tape conductors (and/or one or more normal conductors) with solder and melting the solder after assembly of the layers of tape conductors on the former, as described above. Yet further embodiments of such methods include winding one or more solder sheaths, normal conductor layers and/or insulated resistive wires with or between the tape conductors, as described above.

Thus, in example embodiments described herein, a relatively small diameter former allows the cable to be made relatively compact. By winding one or more superconducting tape conductors in a compression state, irreversible damage to the superconductor can be prevented. A flexible former allows the cable to be made relatively flexible. Non-limiting example cables and processes for making compact superconducting transmission cables, cables for degaussing, and magnet cables are described below.

EXAMPLE 1

2-Phase Cable (for dc transmission):

An example process for making a two-phase cable (FIG. 2), for example, for dc transmission, is as follows.

A flexible solid or hollow former 14 that has a small outer diameter of 1-10 mm is obtained as a core. Optionally, an insulating layer is wound around the former.

Then, multiple superconducting tapes in one or more layers 112 are helically wound around the former 14 with the superconducting layer 112 on the inside (superconductor under compression). If more than one layer is used, each layer could be wound in opposite direction from its neighbor. This stack of layers is for the first electrical phase of the cable.

Each superconducting tape could be individually insulated to prevent current sharing with its neighbors, or it could be coated with a resistive layer to adjust the resistance between tapes and thus adjust the level of current sharing.

Then, an insulating layer 113 is wound around the stack of superconductors that forms the first electrical phase.

Then, a second stack of superconducting tapes 112' is helically wound on top of the insulating layer, forming the second electrical phase. The higher laying tapes could have their superconducting layer on the outside (under tension) as long as the winding radius and lay angle are large enough to not cause damage to the superconductor.

Then, an insulating layer 113' is wound around the stack of superconductors that form the second phase.

Then, a final stack of superconducting tapes that will form the neutral is helically wound on top of the top insulating layer.

Then, a final insulating layer is wound on the stack of superconductors that form the neutral.

Then the cable is placed in a flexible double-walled cryostat that contains a vacuum space with super insulation.

Cooling can be provided by running a cryogenic liquid or gas through either the hollow former (if present), or around the cable in the cryostat, or both.

EXAMPLE 2

3-Phase Cable (for ac transmission shown in FIG. 3):

An example process for making a three-phase cable, for example, for ac transmission, is as follows.

The process of Example 1 is carried out up to and including helical winding of the second stack of superconducting tapes 112' on top of the insulating layer, to form the second electrical phase and the second insulating layer.

Then, a third stack of superconducting tapes 112' is helically wound on the insulating layer that was wound around the stack of tapes that formed the second electrical phase in the 2-phase cable. This stack now forms the third electrical phase.

Then, an insulating layer 16 is wound around the stack of superconductors that forms the third phase.

Then, a final stack of superconducting tapes that will form the neutral is helically wound on top of the top insulating layer.

Then, a final insulating layer is wound on the stack of superconductors that form the neutral.

Then the cable is placed in a flexible double-walled cryostat that contains a vacuum space with super insulation.

Cooling can be provided by connecting the former to a conduit for running a cryogenic liquid or gas through either the hollow former (if present), or around the cable in the cryostat, or both.

EXAMPLE 3

Multi-Phase Cable (for ac transmission):

Another example process for making a multi-phase cable, for example, for ac transmission, is described with reference to FIG. 5, as follows.

For each phase, a plurality of superconducting tapes 512 are helically wound with the superconducting layer on the inside (under compression) in one or multiple layers around a round hollow or solid former 514 that has a small diameter of 1-10 mm. If more than one layer is used, each layer could be wound in opposite direction from it neighbor layer.

Each superconducting tape 512 could be individually insulated to prevent current sharing with its neighbors, or it could be coated with a resistive layer to adjust the resistance between tapes and thus adjust the level of current sharing.

One or more of the higher laying tapes 512 could have their YBCO layer on the outside (under tension) as long as the winding radius and lay angle are high enough to not cause damage to the superconductor.

In further embodiments, insulation 513 is wound around the former 514 before the superconducting layers are wound.

After the superconducting tapes 512 are wound, insulation 513 is wound around the stack of superconducting tapes.

Figure 5:
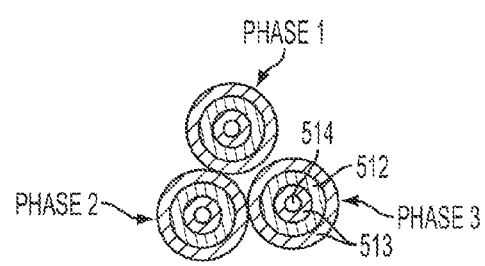
FIG. 5 is a cross-section view of a multi-conductor or multi-phase cable according to an embodiment of the present invention.

Then, a three phase cable is formed by bundling three of these one-phase cores together as shown in FIG. 5.

Then, a shielding layer is formed by winding superconducting tapes around the bundle of three phases, or each phase could have its own neutral that is formed by a stack of superconducting tapes that can be wound on the outside of the cable that forms each phase (not shown).

Then, the shield layer is insulated on the outside (not shown).

Then, the cable is placed in a flexible double-walled cryostat that contains a vacuum space with super insulation (not shown).

Cooling is provided by running a cryogenic liquid or gas through either the hollow former (if present), or around the cable in the cryostat, or both.

EXAMPLE 4

Multi-Core, Rapid-Ramp Cable (for fast-ramping magnets and power transmission cables):

An example process for making a multi-core, fast ramping cable, for example, for fast-ramping magnets and power transmission cables, is described with reference to FIGS. 2 and 3, as follows. Fast ramping could potentially cause the current distribution in cables that consist of many layers to become inhomogeneous. One possible method to force a more even current distribution during ramping is to divide the cable into multiple sections of n layers, which are insulated from each other. Each section will contain the same electrical phase, but will each be connected to and driven by its own respective current source. Each current source can force the correct amount of current in each section, making the current distribution in the cable more even than when only one current source is used. Accordingly, a co-axial 2, 3, or n-phase cable as in FIGS. 2 and 3, may be constructed, but connected for containing the same phase.

EXAMPLE 5

Multi-Core, Low-Loss Cable (for ac transmission):

An example process for making a multi-core, low-loss cable, for example, for ac transmission, is described with reference to FIGS. 6a-c, as follows.

A flexible solid or hollow former 614 that has a small outer diameter of 1-10 mm is obtained as a core. Optionally, an insulating layer may be wound around the former (not shown).

Multiple superconducting tapes in one or more layers 612 are helically wound around the former with the superconducting layer on the inside (superconductor under compression). A small twist pitch is used to reduce the ac losses. The number of layers may be limited to prevent an inhomogeneous current distribution. If more than one layer is used, each layer could be wound in opposite direction from it neighbor.

The higher laying tapes could be wound with their YBCO layer on the outside (under tension) as long as the winding radius and lay angle are high enough to not cause damage to the superconductor.

Each superconducting tape could be individually insulated to prevent current sharing with its neighbors, or it could be coated with a resistive layer to adjust the resistance between tapes and thus adjust the level of current sharing.

Optionally, a layer of insulation 613 is wound around the stack of superconductors.

Then, a number of these single-phase cores 600 are bundled together with full transposition. This will increase the number of tapes per phase, or in the magnet cable, while keeping the amount of layers per core limited. A multi-phase cable for ac transmission is formed by bundling several cores of all phases together.

Then, in the case of a transmission cable, a neutral layer is formed by helically winding a stack of tapes around the bundles (not shown).

Then, an outer insulation layer is wound around the stack of tapes that forms the neutral layer (not shown).

Then, in the case of a transmission cable, the cable will be placed in a flexible double-walled cryostat that contains a vacuum space with super insulation.

Also, in the case of a transmission cable, cooling is provided by running a cryogenic liquid or gas through either the hollow former (if present), or around the cable in the cryostat, or both.

Figure 6A:
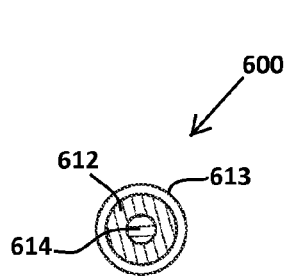
FIGS. 6a-c are cross-section views of single and multiple-core cables according to embodiments of the present invention.
Figure 6B:
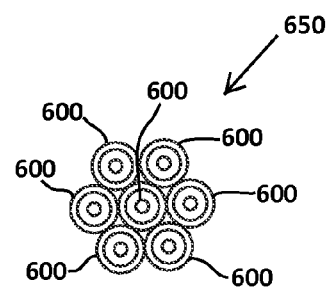
Figure 6C:
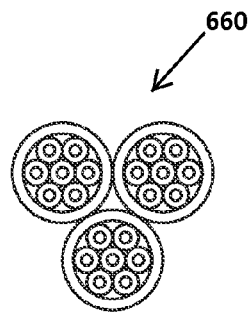

In the drawings, FIG. 6a shows an example of a single core with superconducting tapes, FIG. 6b shows an example of plural single-core cables that are bundled together to form a single or multi-phase cable configuration 650, and FIG. 6c shows a plurality (three) bundles of single-core cables forming a multi-phase (three-phase) cable 660. In a transmission cable, each phase can be formed by its own bundle of same-phase cables, while a 3-phase cable is formed by bundling three of these multi-filament single-phase cables together.

EXAMPLE 6

Multi-Core, Multi-Phase per Core Cable:

A further embodiment may be configured similar to Example 5, above, but with multiple insulated phases on each core, as described in examples 1 and 2. In case of a magnet cable, or fast ramping transmission cable, these phases could be the same, but each section may be connected to and driven by its own respective current source as described in example 4.

EXAMPLE 7

Cable With Improved Electrical Connection Between Tapes:

It may be beneficial to have a relatively large amount of normal conducting material (for instance copper) in parallel with the superconducting tapes in a transmission line or magnet cable to provide the current with an optional shunt path in case of a fault. A current shunt path will also allow the current under normal operating conditions to bypass a damaged section in one of the tapes, or a section where conductors are spliced together. The ceramic layer that is in between the metal substrate and the superconductor in YBCO coated conductors in some cases is resistive and won't allow for current to pass. A normal conducting current path that bypasses the resistive buffer layer and surrounds part or all of the tape can be present to electrically connect the tapes together or to a normal conducting shunt layer. In one embodiment, this can be done by copper plating a thin layer of copper to each individual tape. However, such copper plating can be expensive, or insufficient.

Figure 7:
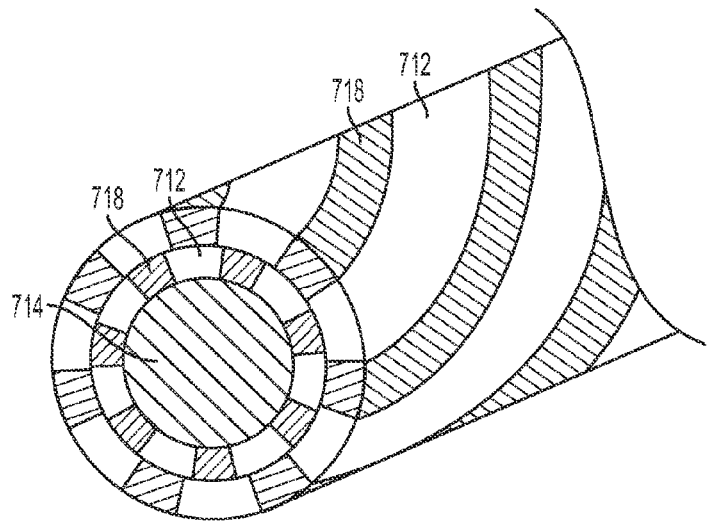
FIG. 7 is a cross-section view of a cable that has a normal conducting matrix.

To improve the electrical connection between the individual tapes of a cable, a normal conducting matrix in which the tapes are embedded can be constructed as shown in FIG. 7 and described as follows.

One or more superconducting tapes 712 (corresponding to the layer(s) of superconducting tape conductors 12) are wound in multiple layers on a former 714 as described in the above examples. In addition, a relatively thin (up to say 20 micron) copper layer (not shown) may be electroplated on and around some or each of the tapes. This layer makes it easier to solder connections to the conductor.

Then, a second layer (not shown) of further electrically conductive material is bonded to and around the superconducting tape 712 by either plating or other suitable methods. The second layer could have a higher electrical resistance than the copper layer and allows for a level of adjustability of the electrical coupling between the superconducting layer of the tapes and the normal conducting matrix between the tapes. Current could transfer to the normal conducting matrix in case of a fault, but the higher resistance of the layer will reduce the coupling losses during normal operation.

In the above embodiment, a strip of normal conducting material (copper) 718 is wound in between the superconducting tapes 712 in each individual layer. The strips 718 have a comparable thickness to that of the superconducting tapes 712.

A layer 716 of normal conducting material is wound between each layer of superconducting tapes. The thickness of the layer 716 is adjustable and will depend on the application.

The winding direction of the superconducting tapes 712 of one or each layer could be opposite to that of one or both neighboring superconducting layers.

Optionally, some of the tapes 712 in some of the layers could be positioned with the superconducting layer facing outward, to enhance the coupling between superconducting tapes.

The current of each superconducting tape can transfer into the normal layer that is next to the superconducting layer. The current could flow from one superconducting layer to the next through the normal conducting strips that are wound between the superconducting tapes in each superconducting layer. This configuration, where a normal conducting matrix is formed in which the superconducting tapes are embedded, allows a current to transfer from one tape to another in case of a local defect, or from the superconducting layers into a normal conducting shunt (either the matrix itself, or some other normal conducting material next to the superconducting layer) in case of a fault.

EXAMPLE 8

Cable With Improved Overcurrent Protection:

In some case, such as transmission lines that are incorporated in the electric power grid, the cable is configured to be able to withstand relatively large overcurrents for a small period of time. A shunting cross-section and additional normal conducting material (such as, but not limited to copper) can be added beside the superconducting layers of any of the above embodiments.

Figure 8:
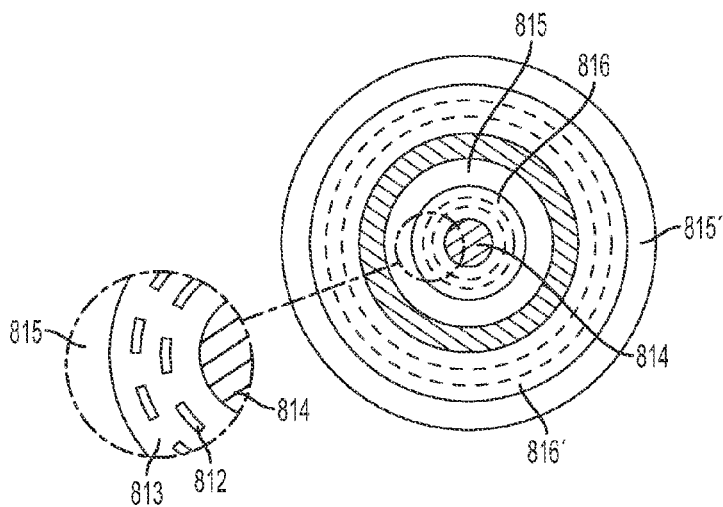
FIG. 8 is a cross-section view of a cable that has additional normal conducting layers for overcurrent protection.

For example, with reference to FIG. 8, a cable configured according to any of the examples described above may be used, but with one or more normally conducting shunt layers 815, 815' and a normal electrically conducting former 814 to provide an additional shunt. The former 814 need not be insulated. In addition, superconducting layers 816, 816' may include superconducting tapes 812 embedded in a normal matrix 813 to form a large degree of electrical coupling between each tape and the shunt.

When more phases are present in the cable, or when the former doesn't provide with enough shunt material, additional normal conducting layers are wound on top of the superconducting layers. Again a normal matrix is preferred to provide good electrical coupling between the tapes and the shunt layer.

In particular embodiments, each phase of the cable has an additional shunt layer on the outside of the superconducting phase. The radius on which the superconducting tapes are wound can remain relatively small by placing the shunt layer on the outside of the cable. This reduces the amount of superconductor needed and allows for small twist pitches of the superconducting tapes.

This approach can be applied to power transmission cables that have a single core on which all phases are wound, or to power transmission cables where each phase is wound around an individual core and where the cables of each phase are bundled together to form the final multi-phase cable.

EXAMPLE 9

Cable With Improved Electrical And Mechanical Coupling Between Tapes:

Relatively large forces may act on the individual tapes in the cable when the cable is used in a magnet. In such environments, it can be beneficial to provide mechanical coupling between the individual tapes of the cable. Such mechanical coupling can be provided by bonding the tapes in each layer together with solder. Such a bonding will also enhance the electrical connection between individual conductors in the cable. An example of a process for improving mechanical bonding is as follows.

In particular, superconducting tapes are wound in multiple layers on a former as described in the above examples.

However, in this example, each superconducting tape and/or normal conducting strip that forms the optional matrix is coated with a thin layer of solder before the cable is wound. Alternatively or in addition, a thin solder foil is wound in between the layers of superconducting tapes, or normal conducting layers that form the optional matrix.

Once the cable is assembled and wound into a system, as for instance a magnet, the complete system is heated in a furnace to melt the solder. After cool-down the solder bonds all of the tapes in each layer and all of the layers together, forming an even better electrical connection and a strong mechanical bond.

In addition, the cable components could be cast in epoxy that will bond the individual cables together. The epoxy may be selected such that curing of the epoxy would occur at a temperature below the melting temperature of the solder in the cable.

EXAMPLE 10

Cable With Improved Flexibility:

For greater flexibility and smaller bending radii, the processes of making the cable may include any of the processes as described above, but with the following modifications.

In particular, the process may further include introducing a small gap between the superconducting tapes in each layer during winding. The size of the gap depends on the minimum bend radius that the cable will experience when wound into an application, the tape width and the lay angle. The gap closes on the inside of the cable and widens on the outside of the cable when the cable is bent into the form of the application. The gap on the inside prevents the superconducting tapes from being pushed into each other, which may cause damage.

Since small bending diameters are often required in magnets where the forces on the cable and its conductors can be large, reinforcement of the cable can be provided by the solder procedure discussed above. The solder is melted after the cable is bent in its final shape. The solder will partly or completely fill the remaining gaps between the tapes in each layer, providing an electrical and mechanical support to each of the superconducting tapes.

EXAMPLE 11

Cable With Spliced Superconducting Tapes:

YBCO coated conductors are typically produced in lengths up to about 1 km. Accordingly, superconducting tapes are spliced together when used in longer cables. Where the joint between these conductors is not superconducting, current typically flows though a low-resistive material from one superconductor to the other. Certain ultra-compact cable embodiment of the present invention allows such a current transfer through for instance the normal conducting matrix that surrounds the superconducting tapes. Accordingly splices need not overlap and thus need not increase the thickness of the superconducting layer locally. Coated conductor splices between conductors can be made using the following example approaches.

Two coated conductors are jointed at the ends by soldering or welding the substrates together. In particular embodiments, the contacting ends of the conductors are tapered to increase the contact area, or a conducive wedge member could be applied between ends of the conductors to do the same. This can result in a total conductor that has an even thickness along its length (see FIG. 9*a-d*).

Figure 9A:
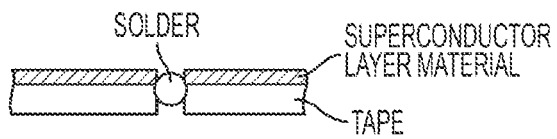
FIGS. 9a-d are cross-section views of examples of spliced tape ends according to embodiments of the present invention.
Figure 9B:
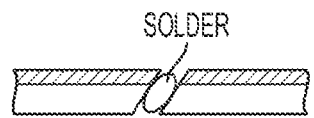
Figure 9C:
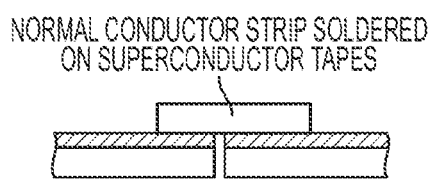
Figure 9D:
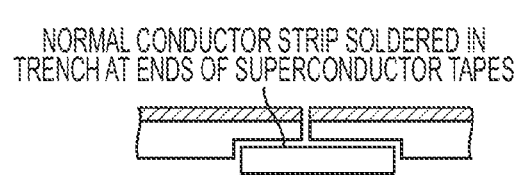

A conductive layer (such as a copper layer) could be plated onto the conductors before or after the connection is made. As shown in FIG. 9*c*, according to one example embodiment, a superconducting layer can be covered by a metal layer, such as silver or silver alloy. In an example embodiment, the use of silver allows soldering to occur on the silver covering without damaging the superconducting cable.

Figure 10A:
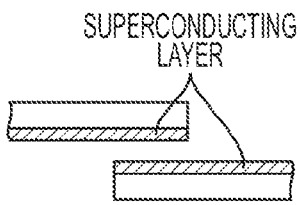
FIGS. 10a-c are cross-section views of examples of spliced tape ends according to further embodiments of the present invention.
Figure 10B:
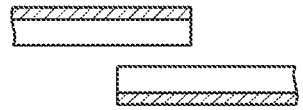
Figure 10C:
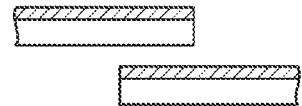

When the variation in conductor thickness is allowed (for instance in a transmission line), the coated conductors could be soldered together while overlapping. Since current transfer between the tapes will occur through the normal conducting matrix, the conductors could be soldered in such a way that the YBCO layers are not facing each other. This will keep the orientation of the YBCO on both sides of the splice the same (see FIG. 10*a-c*).

An overlapping splice can be formed by soldering the end of one of the tapes on top of the other tape, but not soldering the entire splice. This will keep the splice flexible when cabled. The splice can be fully soldered by melting additional solder that was located in the splice, after the cable is assembled.

The electrical and mechanical connection between superconductors can be improved by applying solder between the conductors as discussed above, after the spliced conductors are wound into a cable.

EXAMPLE 12

Cable With Reinforcement:

The forces that act on the cable in some magnet applications can be sufficiently large that reinforcement of the cable can be beneficial. For example, a stainless steel outer jacket may be provided for reinforcement. Various example processes can be used to reinforce YBCO coated conductor cables.

For example, in an example embodiment, a single core superconducting cable as described above is inserted in a metal jacket, where the jacket consists of two half shells that are welded together after the cable is inserted. The jacket could have an outer cross-section of any suitable shape (including, but not limited to a rectangular, round or oval outer cross-section), but has an inner cross-section that matches the shape of the cable. Cooling of the cable is done either by using a hollow former and passing cooling fluid through a hollow former, or by passing cooling fluid between the cable and the jacket.

In further embodiments, multiple single-core superconducting cables are bundled. In such embodiments, normal conducting strands can be included to fill the voids and to provide a shunt and with hollow tubes (the former and/or outer jacket) that are used for cooling.

EXAMPLE 13

Figure 11A:
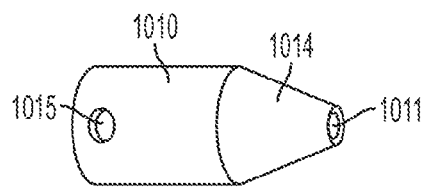
FIGS. 11a-b are examples of cable terminals.

Cable Terminals:

A cable as described herein can include many superconducting tapes. These tapes can be connected to a normal conducting terminal through which the current can be introduced. Such terminals can be constructed as shown in FIGS. 11a and 11b and as described below.

Each terminal is constructed from a cylindrical end piece 1010 of normal conducting material (such as, but not limited to copper). The former on which superconducting tapes are wound (as described in any of the above embodiments) is fed through an opening 1011 in the center of the terminal end piece 1010.

Figure 11B:
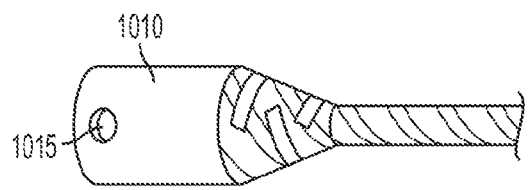

The end 1014 of the terminal end piece facing the cable is machined into a conical end piece on which the tapes are spread out and soldered, when a former is inserted into the opening 1011, as shown in FIG. 11b.

The opposite end of the terminal end piece 1010 has through holes 1015, or bolt holes onto which external cables can be bolted.

Two additional, optional shells can be soldered on the conical end piece, covering the ends of the tapes (not shown).

EXAMPLE 14

Single-Phase Cable Configuration:

As a representative, non-limiting example, a cable may be configured in any suitable length, such as, but not limited to 0.5 m in length, and includes up to twenty-four superconducting tape conductors in up to eight layers around a flexible, copper former having a 5.5 mm outer diameter. For example, in a twenty-four tape, eight layer embodiment, each layer includes three superconducting tape conductors. The superconducting tape conductors are wound with their superconducting layers facing inward, such that they were under compressive strain.

A cable that has twenty-four superconductor tape conductors may be able to carry as much as 2800 A at 76 K, which can be more than 90% of the current that all individual conductors could carry combined, before they were wound into the cable.

Without significant gaps between tape conductors, a cable having twelve superconducting tape conductors wound in three layers around an insulated, flexible, copper former of 5.5 mm diameter, may be able to be bent in a 24 cm diameter bend without degradation in current carrying capacity. However, gaps may be formed between neighboring superconducting tape conductors, for example, to allow greater bending (to diameters well below 24 cm), without significant damage to the cable.

Where such example embodiments are not inconsistent with each other, various example embodiments described above (or portions thereof) may be used together and interchangeably in yet further embodiments of the present invention.

EXAMPLE 15

Two-Phase Cable Configuration:

A cable that can apply to certain Air Force applications includes two electrical phases that are wound on one former, on top of each other, with a layer of insulation in between the phases. In one example, a cable has 79 tapes in 17 layers on a 5.5 mm diameter former and can carry a current of up to 7561 A in liquid nitrogen, when the current in both phases runs in the same direction.

EXAMPLE 16

Magnet Cable Configuration:

A further example of a high performing cable includes 40 conductors on a 4 mm diameter former in 12 layers. The cable is wound into a 1.5 turn loop of outer diameter 12 cm (10.5 cm inner diameter). The cable can carry up to 4100 A at 4.2 K in a background field of 20 T oriented perpendicular to the cable.

EXAMPLE 17

Magnet Cable Quench Protection:

In case that a superconducting magnet experiences a fault that drives the superconducting cable normal locally, all energy that is stored in the magnet will be dissipated in a small normal zone. To prevent burnout during a magnet quench, the magnet cable must be driven normal over its entire length in a relative short time to distribute the dissipative energy over the entire magnet. A method that allows for such a rapid transition from superconducting to normal state of a cable includes co-winding one or more heater wires with the superconducting tapes, and/or incorporate a heater wire within the former. The heater wire is energized using an external power source as soon as a magnet quench is detected.

Embodiments disclosed herein are to be considered in all respects as illustrative and not restrictive of the invention. The scope of the invention is indicated by the appended claims, rather than the foregoing description. All changes that come within the meaning and range of equivalency of the claims are therefore intended to be embraced therein.

What is claimed is:

1. A superconducting cable comprising:
   a former;
   a plurality of superconducting tape conductors wound in a plurality of layers around the former in a helical fashion, each superconducting tape conductor having at least one superconducting layer, wherein each layer is arranged either over or under at least one other layer in the plurality of layers in a radial direction; and
   at least one conductor of non-superconducting, conductive material wound between two of the layers of superconducting tape conductors.

2. The superconducting cable of claim 1, where the former has an outer diameter of less than ten millimeters (10 mm).

3. The superconducting cable of claim 1, where the former is flexible.

4. The superconducting cable of claim 1, where the plurality of superconducting tape conductors are wound around the former with pretension.

5. The superconducting cable of claim 1, where the plurality of superconducting tape conductors are wound around the former with a gap between winds of at least two of the superconducting tape conductors.

6. The superconducting cable of claim 1, further comprising at least one electrically insulated, resistive heating wire wound around the former, for providing a quenching heat source.

7. The superconducting cable of claim 1, further comprising at least one sheath provided around the plurality of superconducting tape conductors and the former.

8. The superconducting cable of claim 1, where at least one of the plurality of superconducting tape conductors is wound such that a superconducting layer on the superconducting tape conductor is located on the inside of the wind, under compression.

9. The superconducting cable of claim 1, where at least one of the plurality of superconducting tape conductors is wound such that a superconducting layer on the superconducting tape conductor is located on the outside of the wind, under tension.

10. The superconducting cable of claim 1, where at least one of the plurality of superconducting tape conductors is wound such that a superconducting layer on the superconducting tape conductor is located in a central position on the tape conductor, under neither tension nor compression from the wind.

11. The superconducting cable of claim 1, where each layer of the superconducting tape conductors is wound in a different winding direction as an adjacent layer of the superconducting tape conductors.

12. The superconducting cable of claim 1, where each layer of the superconducting tape conductors is wound in the same winding direction as an adjacent layer of the superconducting tape conductors.

13. The superconducting cable of claim 1, where each layer of the superconducting tape conductors is wound at a pitch angle that is different from a pitch angle of tape conductors wound in an adjacent layer.

14. The superconducting cable of claim 1, where each layer of the superconducting tape conductors is being wound at a pitch angle that is comparable to the pitch angle of tape conductors wound in an adjacent layer.

15. The superconducting cable of claim 1, where at least two adjacent layers of the superconducting tape conductors are separated apart from each other.

16. The superconducting cable of claim 1, where the former has a cross-section shape that is oval or rectangular with rounded corners, with the radius of the corners being less than five millimeters (5 mm).

17. The superconducting cable of claim 1, where at least one insulation layer is provided between adjacent layers of superconducting tape conductors.

18. The superconducting cable of claim 1, where at least one of superconducting tape conductors is insulated.

19. A superconducting cable comprising:
    a former;
    a plurality of superconducting tape conductors wound in at least one layer around the former in a helical fashion, each superconducting tape conductor having at least one superconducting layer; and
    solder that is configured to be melted after the cable is assembled, the solder comprising (a) a layer of solder coated on at least one of the superconducting tape conductors such that the at least one superconducting tape conductor with the layer of solder is wound around the former, (b) a solder material wound between adjacent winds of the superconducting tape conductors, or (c) a solder material arranged between at least two of the layers where the at least one layer comprises a plurality of layers.

20. The superconducting cable of claim 1, further comprising a solder sheath wound between adjacent winds of the superconducting tape conductors, where the solder sheath is configured to be melted after the cable is assembled.

21. The superconducting cable of claim 1, wherein the superconducting cable further comprises at least one solder sheath arranged between at least two of the plurality of layers.

22. The superconducting cable of claim 1 where the at least one conductor of non-superconducting, conductive material further comprises at least one conductor wound between adjacent windings of at least one of the superconducting tape conductors in at least one layer of superconducting tape conductors.

23. The superconducting cable of claim 1, where the at least one conductor of non-superconducting, conductive material is covered by a layer of solder configured to be melted.

24. A bundle of superconducting cables comprising a plurality of superconducting cables, each having a configuration as recited in claim 1, where at least one superconducting cable has an outer insulating layer and is held in a bundle with the other superconducting cables of the plurality of superconducting cables.

25. A bundle of superconducting cables comprising a plurality of superconducting cables, each comprising:
    a former; and
    a plurality of superconducting tape conductors wound in at least one layer around the former in a helical fashion, each superconducting tape conductor having at least one superconducting layer;
    where each superconducting cable lacks an outer insulating layer and is held in a bundle with the other superconducting cables of the plurality of superconducting cables; and the bundle comprises a sheath covering the bundle of cables.

26. A method of making a superconducting cable comprising:
provide a former;
winding a plurality of superconducting tape conductors in a plurality of layers around the former in a helical fashion, each superconducting tape conductor having at least one superconducting layer, wherein each layer is arranged either over or under at least one other layer in the plurality of layers in a radial direction; and
winding at least one conductor of non-superconducting, conductive material between two of the layers of superconducting tape conductors.

27. The method of claim 26, where the former has an outer diameter of less than ten millimeters (10 mm).

28. The method of claim 26, where the former is flexible.

29. The method of claim 26, where winding the plurality of superconducting tape conductors comprises winding the plurality of superconducting tape conductors around the former with pretension.

30. The method of claim 26, where winding the plurality of superconducting tape conductors comprises winding the superconducting tape conductors around the former with a gap between at least two adjacent winds.

31. The method of claim 26, where at least one of the plurality of superconducting tape conductors is wound such that a superconducting layer on the superconducting tape conductor is located on the inside of the wind, under compression.

32. The method of claim 26, where at least one of the plurality of superconducting tape conductors is wound such that a superconducting layer on the superconducting tape conductor is located on the outside of the wind, under tension.

33. The method of claim 26, where winding the plurality of superconducting tape conductors comprises winding such that a superconducting layer on the superconducting tape conductor is located in a central position on the tape conductor, under neither tension nor compression from the wind.

34. The method of claim 26, where winding the plurality of superconducting tape conductors comprises winding each layer in a different winding direction as an adjacent layer.

35. The method of claim 26, where winding the plurality of superconducting tape conductors comprises winding each layer at a pitch angle that is different from a pitch angle of tape conductors wound in an adjacent layer.

36. The method of claim 26, where the method further comprises providing at least one insulation layer between each adjacent layer of superconducting tape conductors.

37. The method of claim 26, further comprising coating at least one of the superconducting tape conductors with a layer of solder before winding the at least one superconducting tape conductor around the former, and melting the solder after the at least one superconducting tape conductor is wound around the former.

38. The method of claim 26, further comprising further comprising winding a solder sheath between adjacent winds of the at least one superconducting tape conductor, and melting the solder sheath after the at least one superconducting tape conductor is wound around the former.

39. The superconducting cable of claim 1, where the former has a diameter of no more than ten millimeters (10 mm), where each superconducting tape conductor includes a substrate having a surface on which the at least one superconducting layer is supported such that the at least one superconducting layer forms an outer surface of the superconducting tape conductor, and where each superconducting tape conductor being wound around the former with the outer surface formed of the at least one superconducting layer facing inward toward the former.

40. The superconducting cable of claim 6, where the plurality of layers of the superconducting tape conductors comprises at least two adjacent layers of superconducting tape conductors wound in opposite directions relative to each other, and wherein the at least one electrically insulated, resistive heating wire is wound in parallel to one of the superconducting tape conductors wound around the former.

41. The superconducting cable of claim 1, wherein the plurality of superconducting tape conductors are wound at a pitch angle in the range of 24 degrees to 63 degrees.

42. The superconducting cable of claim 1 where at least one conductor of non-superconducting material is wound in electrical communication with at least one superconducting tape conductor in at least one of the plurality of layers of superconducting tape conductors.

43. The superconducting cable of claim 1 where at least one conductor of non-superconducting material is wound between at least one pair of adjacent layers of superconducting tape conductors.

44. The superconducting cable of claim 43 where at least one conductor of non-superconducting material forms electrical connections with superconducting tape conductors in at least one adjacent layer of superconducting tape conductors.

* * * * *